(12) United States Patent
DeCosta

(10) Patent No.: US 9,263,863 B2
(45) Date of Patent: Feb. 16, 2016

(54) METHOD AND APPARATUS FOR POSITIONING IN-WALL POWER

(76) Inventor: Thomas J. DeCosta, Westport, MA (US)

( * ) Notice: Subject to any disclaimer, the term of this patent is extended or adjusted under 35 U.S.C. 154(b) by 987 days.

(21) Appl. No.: 13/506,136

(22) Filed: Mar. 29, 2012

(65) Prior Publication Data

US 2012/0256496 A1 Oct. 11, 2012

Related U.S. Application Data

(60) Provisional application No. 61/516,768, filed on Apr. 7, 2011, provisional application No. 61/630,677, filed on Dec. 16, 2011.

(51) Int. Cl.
*H02G 5/00* (2006.01)
*H02G 1/00* (2006.01)

(52) U.S. Cl.
CPC ........................................ *H02G 1/00* (2013.01)

(58) Field of Classification Search
CPC .................................... H01B 7/30; H02G 5/00
USPC ............................................................ 307/147
See application file for complete search history.

(56) References Cited

U.S. PATENT DOCUMENTS

| | | | | |
|---|---|---|---|---|
| 4,255,746 A | * | 3/1981 | Johnson et al. | 340/577 |
| 5,693,909 A | * | 12/1997 | McEwen | 174/58 |
| 6,956,169 B1 | * | 10/2005 | Shotey et al. | 174/58 |
| 2011/0021066 A1 | * | 1/2011 | Squires | 439/502 |

* cited by examiner

*Primary Examiner* — Rexford Barnie
*Assistant Examiner* — Joseph Inge

(57) ABSTRACT

The present invention discloses a method and apparatus for locating a pre-wired electrically isolated power source. The invention includes a plurality of embodiments of encased receptacles combined with recessed electrical enclosures for mounting the receptacles. The recessed electrical enclosures allow for the input and output receptacles to be mounted externally to the enclosure, to create space internal to the enclosure, and for visual isolation of receptacle outlets and associated plugs/connectors that may also be present in the enclosure.

4 Claims, 27 Drawing Sheets

METHOD AND APPARATUS FOR POSITIONING IN-WALL POWER

CROSS-REFERENCE TO RELATED APPLICATIONS

This application claims priority to U.S. Provisional Application No. 61/516,768 filed 7 Apr. 2011 and U.S. Provisional Application No. 61/630,677 filed 16 Dec. 2011.

FIELD OF THE INVENTION

The present invention relates to a method and apparatus for locating a pre-wired electrically isolated power source. The invention includes a plurality of embodiments of encased receptacles and recessed electrical boxes for mounting these embodiments.

BACKGROUND OF THE INVENTION

Providing electrical power behind a wall structure currently requires the use of a standard electrical receptacle and wiring to be mounted internal to an electrically isolated box to prevent access to the internal wiring. Typically, an electrician is required to complete the installation which requires connecting into existing power and locating the new electrical receptacle and box.

The electrical box includes a cover plate flush mounted to the exterior wall leaving an opening for the power receptacle.

More recently, some electrical appliances, particularly flat screen televisions, are mounted directly to the wall, so that externally connected plugs protruding out of the wall plate interfere with mounting the television in flat abutment with the surface of the wall.

There exists a need for a method and apparatus for positioning in-wall power which can be accomplished by a lay person without the need of an electrician, and which provides electrically isolated receptacles, that are pre-wired, and can be mounted external to an electrical box, thereby creating space internal to the wall for isolating plugs and connectors.

SUMMARY OF THE INVENTION

The foregoing and other problems are overcome, and other advantages are realized, in accordance with the disclosed, alternative embodiments of these teachings.

The power solution of the present invention comprises pre-wired electrically isolated female and male receptacles combined with an integrated enclosure that can be used in applications where power must be supplied to a remote unit, such as a flat panel TV being hung on a wall (behind wall installation), or in a remote location where an integrated enclosure is necessary for installation and electrical isolation (trade show/outdoor exhibit where remote power is utilized on a temporary wall fixture).

For behind wall installations the invention may combine isolated power receptacles in combination with "Deep Box" mounting enclosures. The "deep box" enclosures allow for the input and output receptacles to be mounted deep inside a wall for visual isolation of receptacle outlets and associated plugs/connectors that may also be present in the enclosure.

In a behind wall installation, the integrated enclosures containing the female and male receptacles are separated behind a wall such that power can be supplied to the female end from an external source (such as an extension cord) which will supply power to a male receptacle mounted interior to the wall. The integrated enclosures for the receptacles are necessary to facilitate mounting in a variety of forms. Both the power input (female end) and power output (male end) integrated enclosures may contain a mounting frame for installation directly to a wall surface or onto any type of faceplate or in-wall enclosure, such as the "deep box" mounting enclosures of the present invention.

Alternatively, the integrated enclosures may be sold pre-mounted to any in-wall enclosure, including the "deep Box" enclosures of the present invention. Further, the integrated enclosed receptacles, interface wiring, and associated mounting frames or boxes (deep box or conventional electrical box) may be sold as a kit to facilitate easy installation. The electrical connection between the integrated enclosures may be separable via a snap plug or the like.

The integrated enclosures facilitate mounting of the power output and power input to a variety of electrical boxes including standard electrical boxes, flush mounted wall plates, and "deep boxes" disclosed in the present invention. Since the receptacles are encased and pre-wired, they are not required to be mounted internal to an electrical box for electrical isolation. This allows for the receptacles to be mounted externally to the electrical box enclosure, creating additional space within the box necessary for hiding connectors and the like. The encased receptacles may also be rough mounted to any wall surface.

The power input and power output integrated enclosure may be formed by overmolding, be a one piece boot, a two piece joinable encasement, or may comprise an integrated enclosure built around an overmolded connector. The receptacles are electrically connected within the integrated enclosure at the factory (pre-wired) and the electrical coupling between the enclosures can be ordered in specific lengths to meet the needs of a particular installation.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 1:
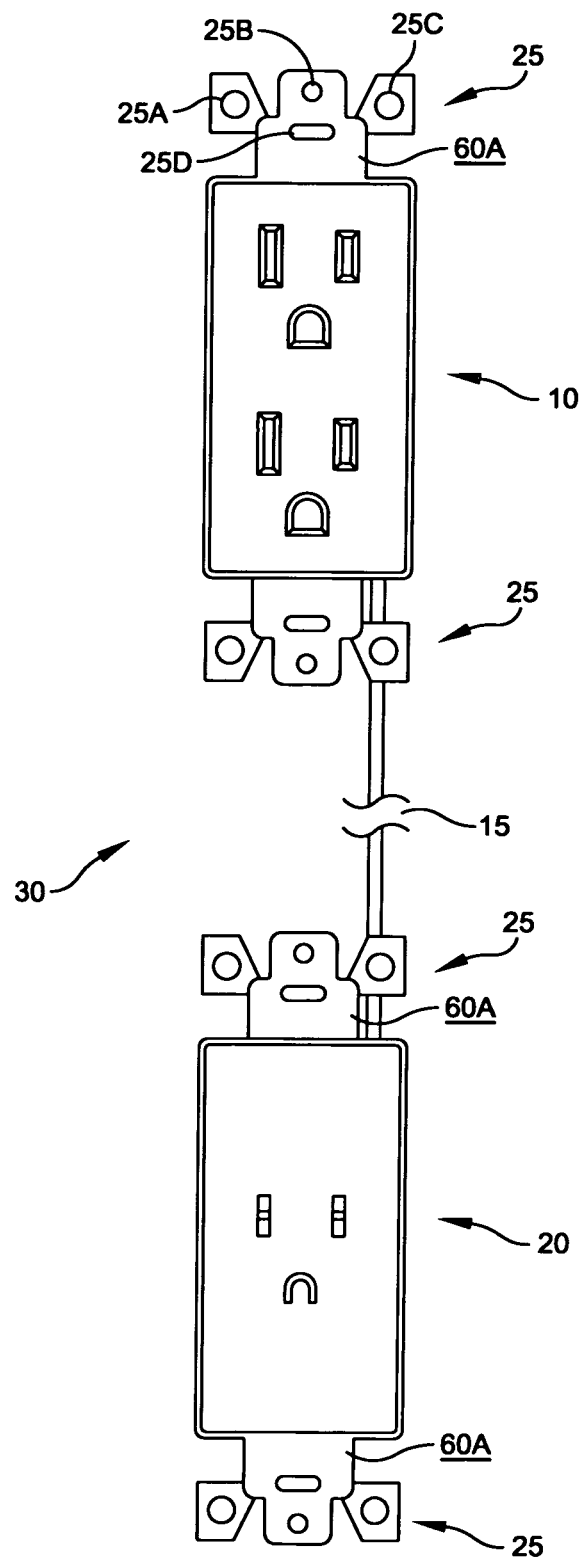
FIG. 1 illustrates an embodiment employing the principles of subject invention denoting encased receptacles as encased power input and power output with an electrical interface as any length necessary for a particular installation.
Figure 2:
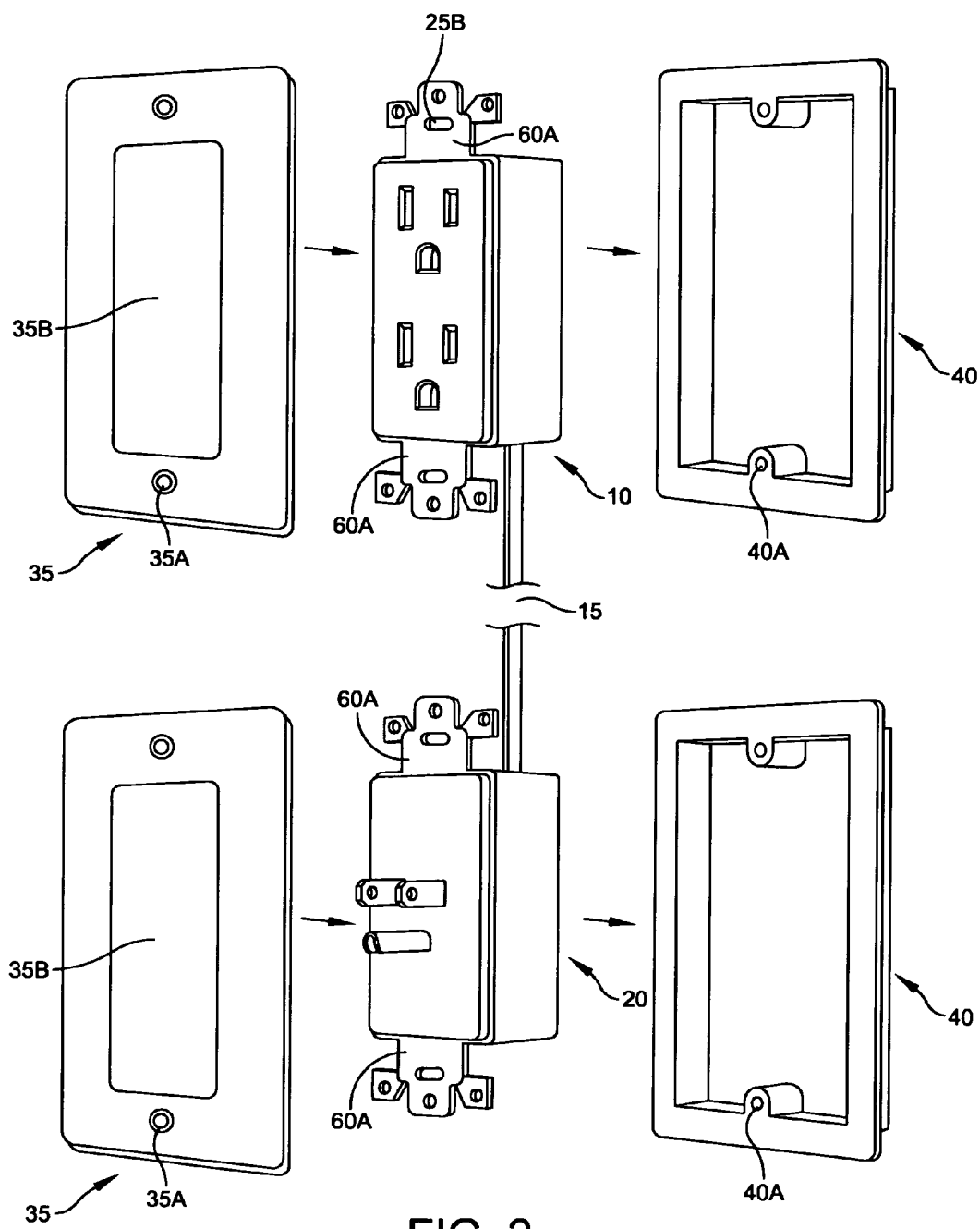
FIG. 2 illustrates the embodiment of FIG. 1 having faceplates for connection to the encased receptacles.

While certain embodiments of the present invention have been illustrated and described herein, the present invention should not be limited to such illustrations and descriptions. It should be apparent to those skilled in the art that changes and modifications may be incorporated and embodied as part of the present invention and are within the scope of the claims. It is understood that the "deep box" embodiments disclosed can also be utilized with "low voltage" receptacles connected thereto.

As seen in FIGS. 1-4, the integrated enclosure in the form of an encased power output 10 and encased power input 20 are illustrated as connected by an electrical coupling 15.

Coupling 15 contains the electrical connections between power input 20 and power output 10, and may include solid copper conductors and combinations of hot, neutral and ground conductors encased in any electrical interface conduit as required by applicable building codes.

The assembled In-Wall power apparatus 30 is purchased for particular applications with a fixed length electrical coupling 15. In the alternative, encased power input 20 and power output 10, can each contain a fixed length electrical coupling to be connected on-site. Each coupling may be a mating connector or bare wire to be connected during installation. Such an embodiment would facilitate selling components separately.

The encased receptacle embodiment (both power input and power output) and coupling 15 are electrically insulated and pre-wired to meet applicable building codes and further to be installed by a laymen without the need for a licensed electrician.

The encased receptacles 10 and 20 further include mounting frames 60A. The frames may be overmolded, or externally affixed to receptacles 10 and 20. The Mounting frames include tabs 25 including tab connection holes 25A, 25B, 25C, and 25D. Although connection holes 25A-25D are disclosed other connection holes could be included in tab 25. In the preferred embodiment, the mounting frames 60A are substantially co-planer with the front face of receptacles 10 and 20. The selection of holes 25A-25B in the embodiment of FIG. 1-4 is to illustrate the utilization of faceplates 35 and 40. Other mounting frames and tab configurations may be utilized to meet specific installation requirements. Encased standard NEMA, standard duplex, and non-standard custom receptacles require different dimensioned mounting frames and tabs.

Figure 3:
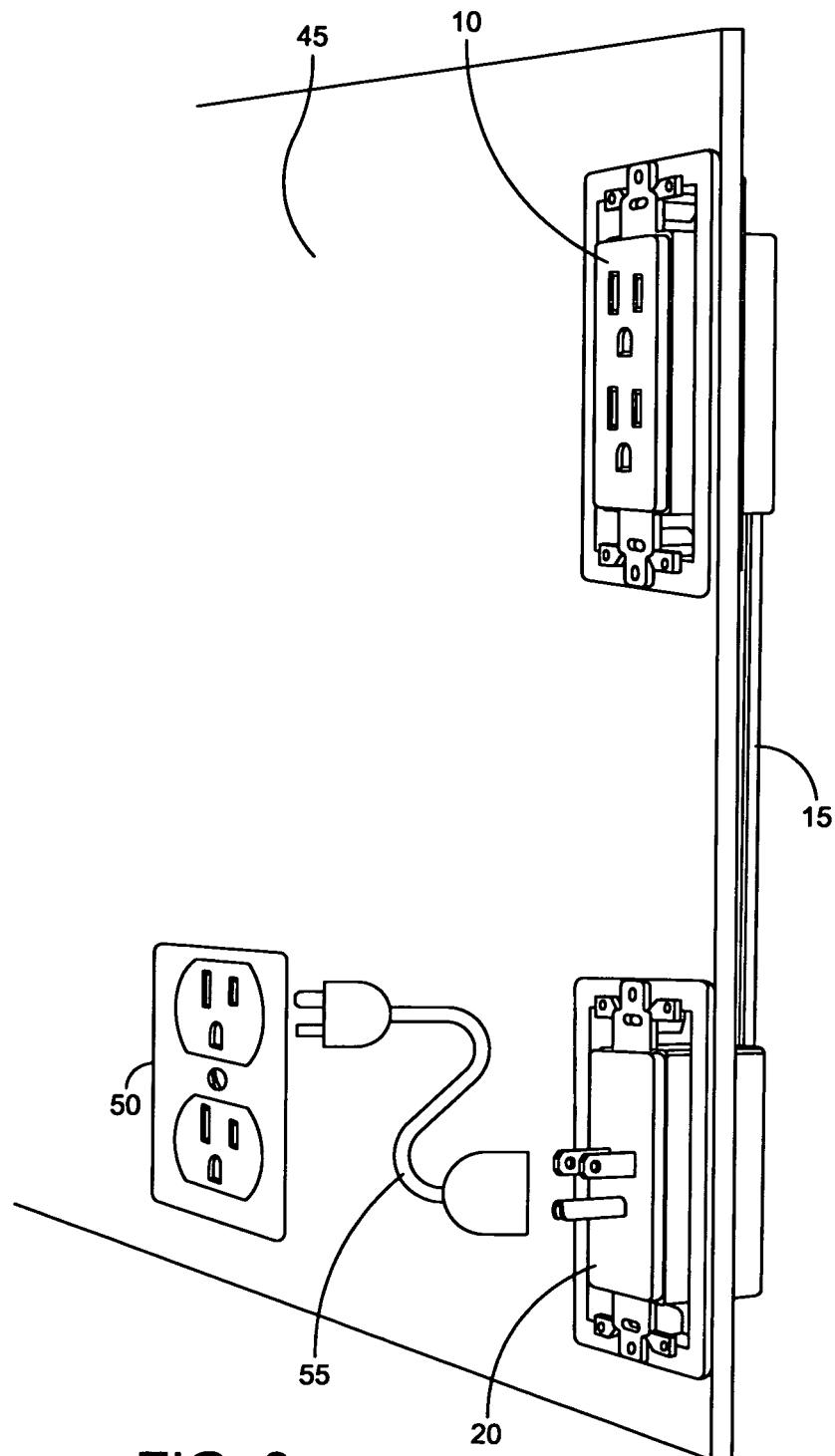
FIG. 3 illustrates the embodiment of FIG. 2 illustrating the installation of the encased receptacles, electrical interface, and faceplates in a wall. Also illustrated is an existing power receptacle with an extension cord for routing available power to the encased power input receptacle via an extension cord.

FIG. 3 illustrates the power apparatus 30 of the present invention affixed to the surface of an exterior wall 45. In the present example, a hole would be cut in the wall for placement of receptacle 10 in an elevated location on the wall 45. Even without installing decorative faceplates 35 and 40, the receptacles 10 and 20 can be installed, as is, in wall 45 by screwing or nailing into the receptacles 10 and 20 via holes 25-thru 25D into wall 45. First, two holes would be made in wall 45. Next, Receptacle 20 would be "fished" down to the first hole and receptacles 10 and 20 would be secured within the openings. Preferably, receptacle 20 would be at floor level out of view and in the vicinity of a live power outlet 50 as illustrated in FIG. 3. Live power would then be supplied to receptacle 20 via a conventional extension cord 55. Power would then be available to receptacle 10 for powering, for example, a flat panel TV (not shown) mounted over receptacle 10.

For a more decorative installation, faceplate 40 could be placed within the opening, connected to receptacles 10 and 20 via screw or nails through holes 25D and 40A, then faceplate 35 could be placed over receptacles 10 and 20 and connected over faceplate 40, via screws or nails through holes 35A and 25B. Receptacles 10 and 20 would be accessible through opening 35B of faceplate 35.

Figure 4:
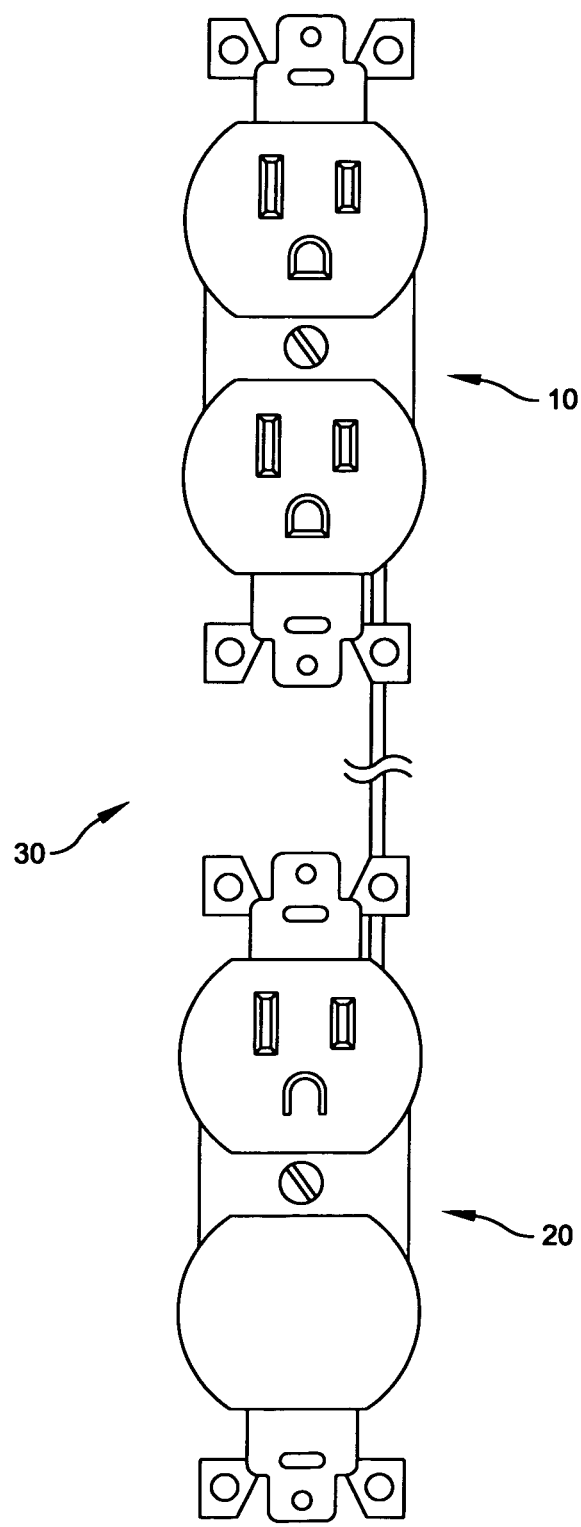
FIG. 4 illustrates an alternative embodiment for the design of the encased receptacles 10 and 20.

FIG. 4 illustrates an alternative embodiment for the design of the encased receptacles 10 and 20.

Other configurations of installations are possible, as described herein, such as recessed power input and power output within a walls interior surface.

An alternative embodiment of encased receptacles 10 and 20 in combination with recessed electrical boxes 120 is illustrated in FIGS. 24-27. It is understood that all embodiments of encased receptacles 10 and 20 described herein are mountable to all embodiments of the recessed electrical boxes described herein.

Various embodiments of recessed electrical boxes for encased power input 20 and power output 10 are contemplated, provided the encasement ensures electrical isolation and can meet applicable building codes.

Figure 5:
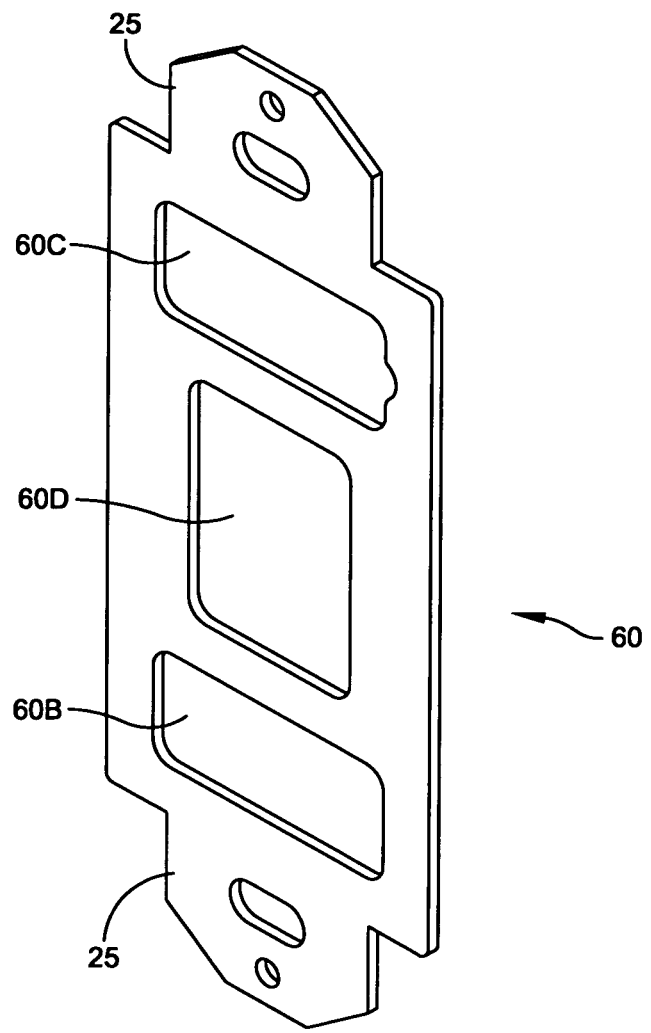
FIG. 5 illustrates a mounting frame utilized in the current invention.
Figure 8:
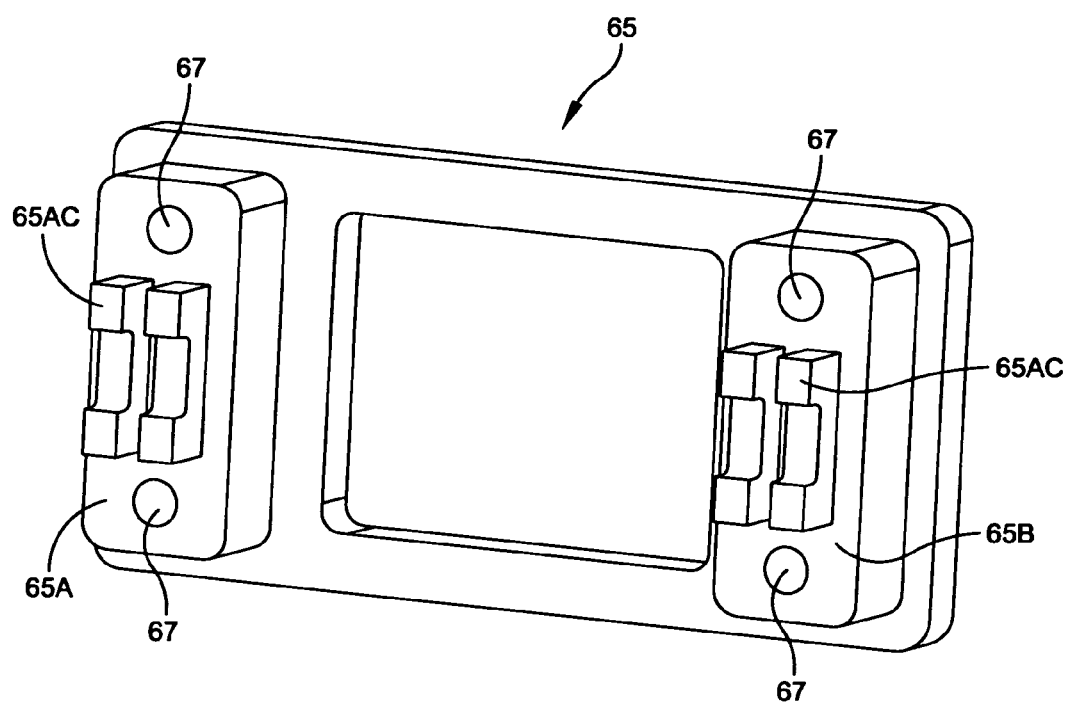
FIG. 8 illustrates a frame support member utilized in the current invention.
Figure 12:
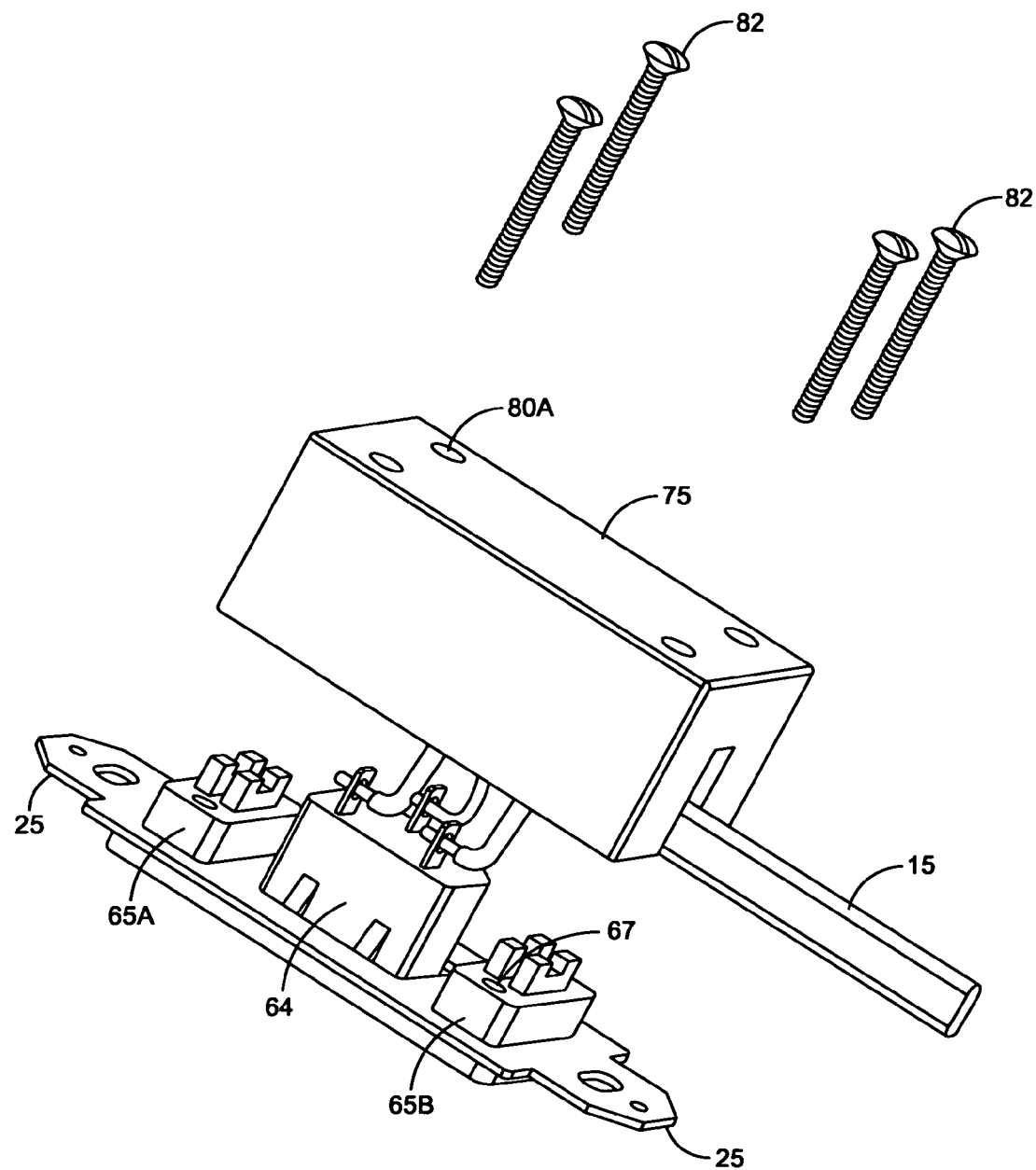
FIG. 12, illustrates the assembled mounting frame and frame support member of FIGS. 7,8 and 11 prior to final assembly.

As illustrated in FIG. 12, an encased receptacle is formed around an IEC power input connector 64. It is contemplated by the present invention to include other connector types to be encased including standard NEMA, standard duplex, and non-standard custom connectors. Referring to FIGS. 5 and 8, a mounting frame 60 includes opposed tabs 25, an opening 60D to receive an IEC power receptacle 64 therein, and openings 60B and 60C to receive stanchions 65A and 65B of frame support member 65.

Figure 6:
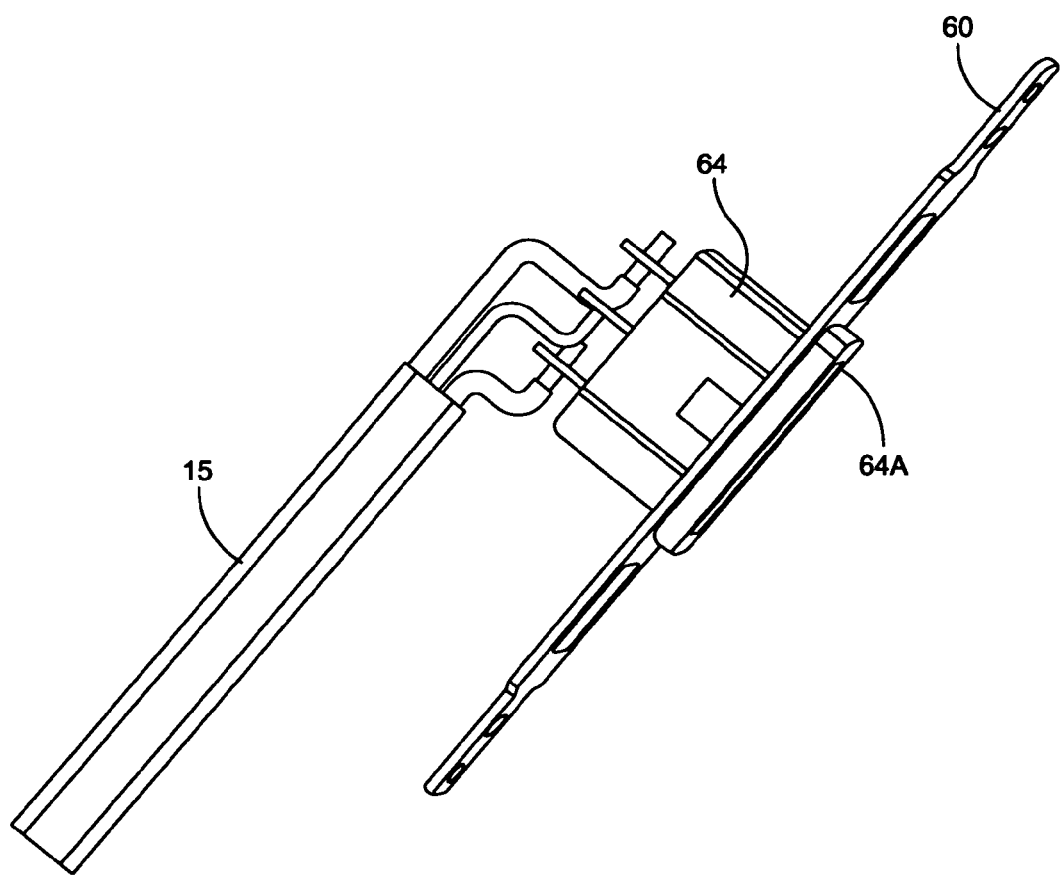
FIGS. 6-7 illustrates an IEC power receptacle integrated into the mounting frame of FIG. 5.
Figure 7:
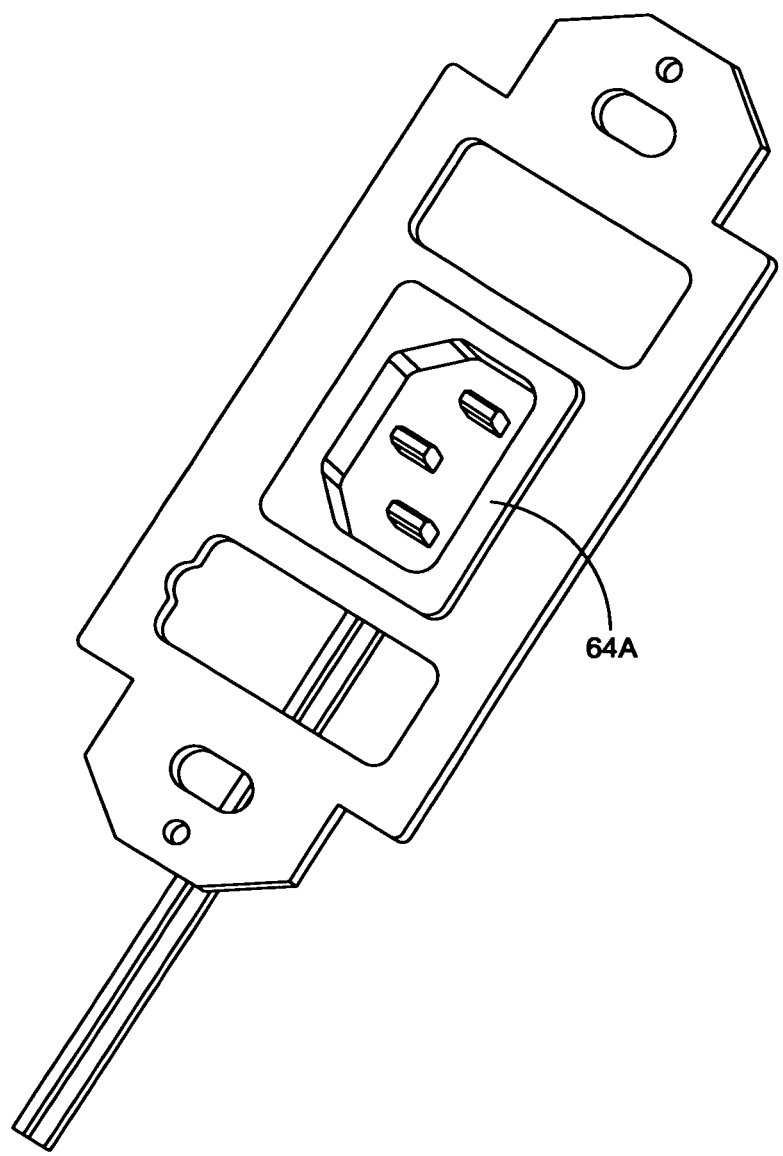
Figure 9:
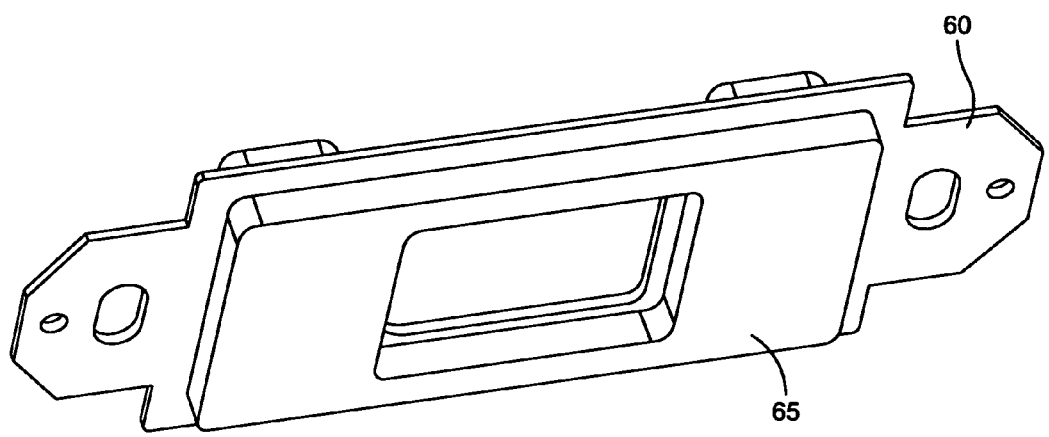
FIGS. 9-10 illustrates the assembled mounting frame and frame support member of FIGS. 5 and 8.
Figure 10:
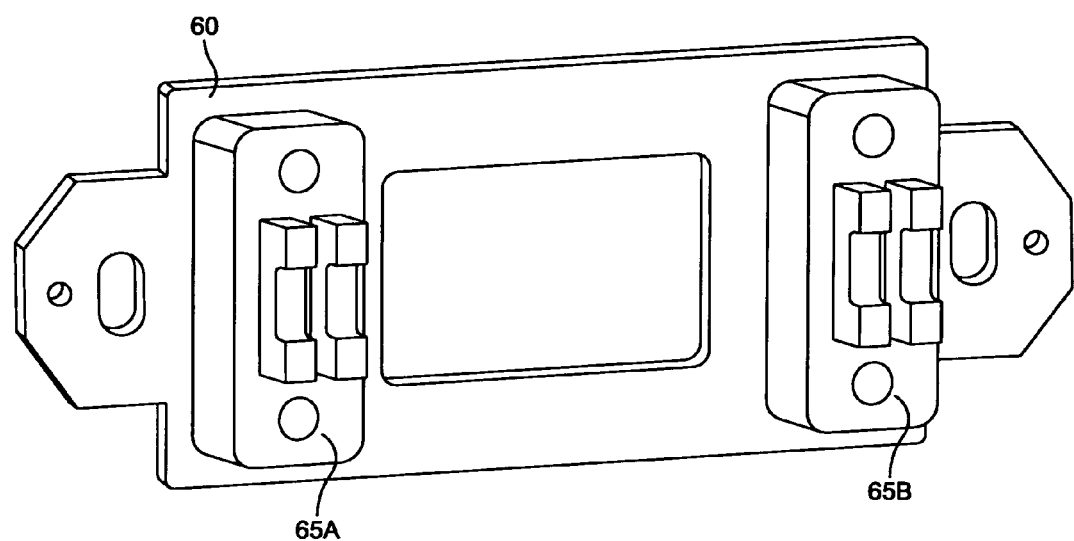
Figure 11:
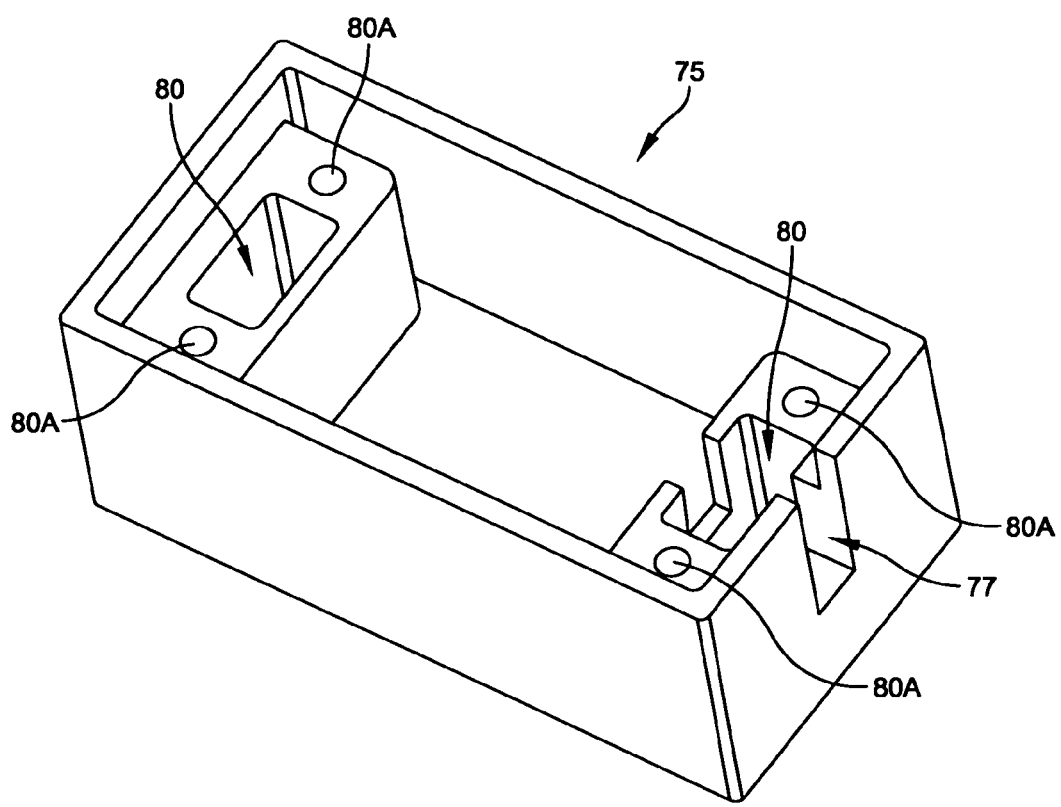
FIG. 11 illustrates a housing embodiment of the encased receptacles of the subject invention.

As illustrated in FIGS. 6 and 7, IEC 64 fits snugly into opening 60D, and includes a surface extension 64A which may be further secured to frame 60 by any means known in the art such as gluing. Frame support member 65, including stanchions 65A and 65B, snugly engage through openings 60B and 60C (FIGS. 9-10), for engagement into housing apertures 80 (FIG. 11), of housing 75. As illustrated in FIGS. 9-10, stanchions 65A and 65B are snugly fit, and frame support member 65 and mounting frame 60 may require gluing or the like to remain securely affixed.

To assemble the integrated enclosure, screws or similar means 82 engage housing apertures 80A and stanchion apertures 67 to couple housing 75 to frame support member 65.

Figure 13:
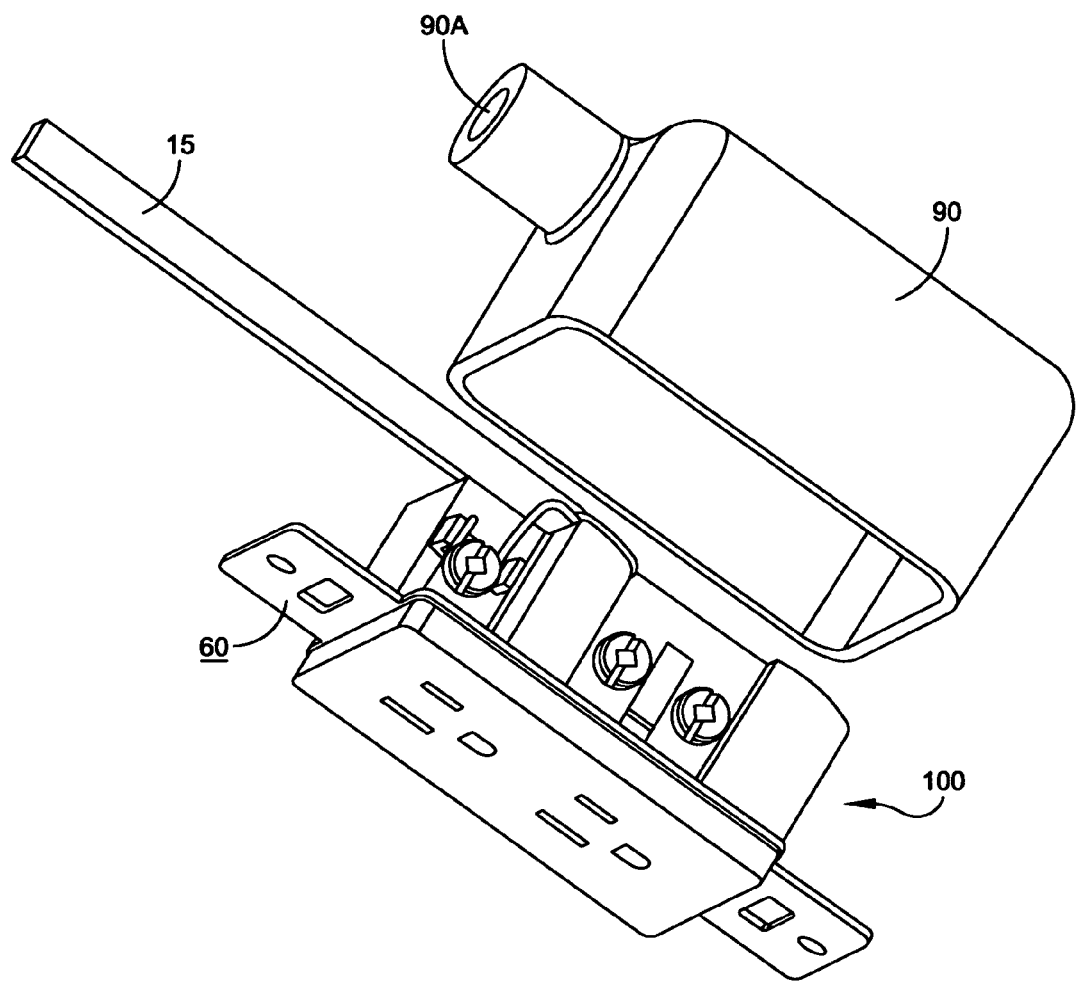
FIG. 13 illustrates a boot embodiment of the encased receptacle of the subject invention.

In an alternative embodiment a molded boot 90 (FIG. 13) can be used to create an encased receptacle. In the above example, the boot 90 could be substituted for housing in glued or sealed contact with mounting frame 60 of receptacle 100. As illustrated in FIG. 13, the boot 90 would include a rearward aperture 90A for routing interface coupling 15. FIG. 13 illustrates a commercial power output receptacle 100 and boot 90, however, it is understood that boot 90 can be used also in the application illustrated in FIG. 12.

Figure 14:
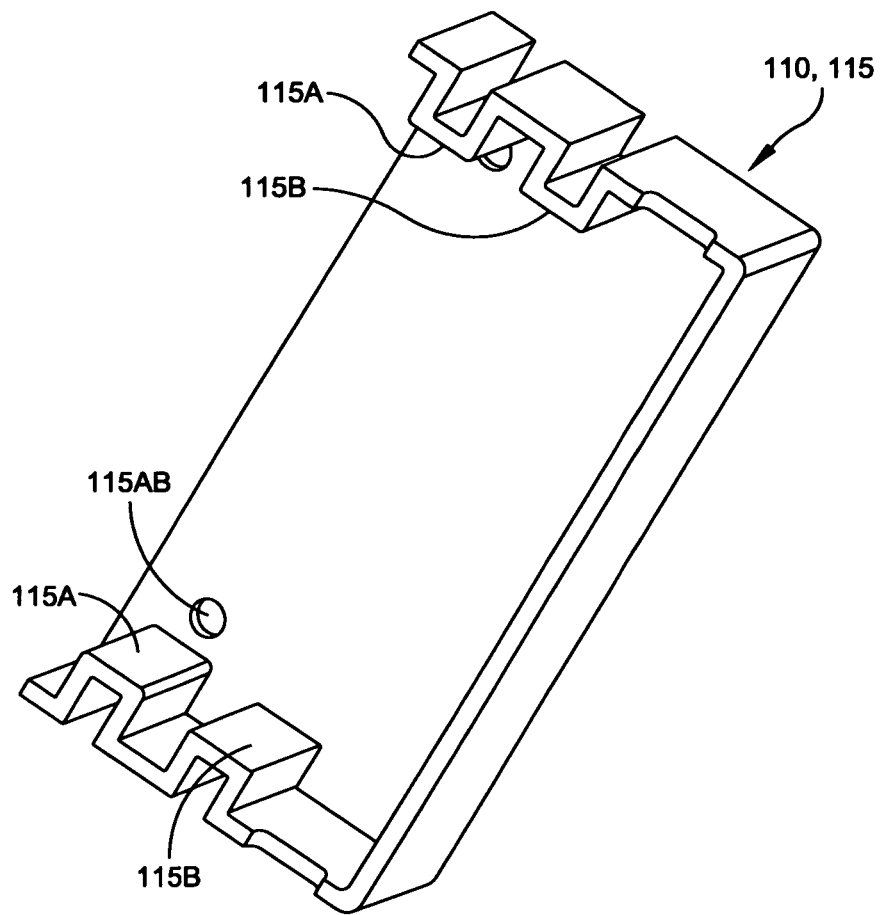
Figure 15:
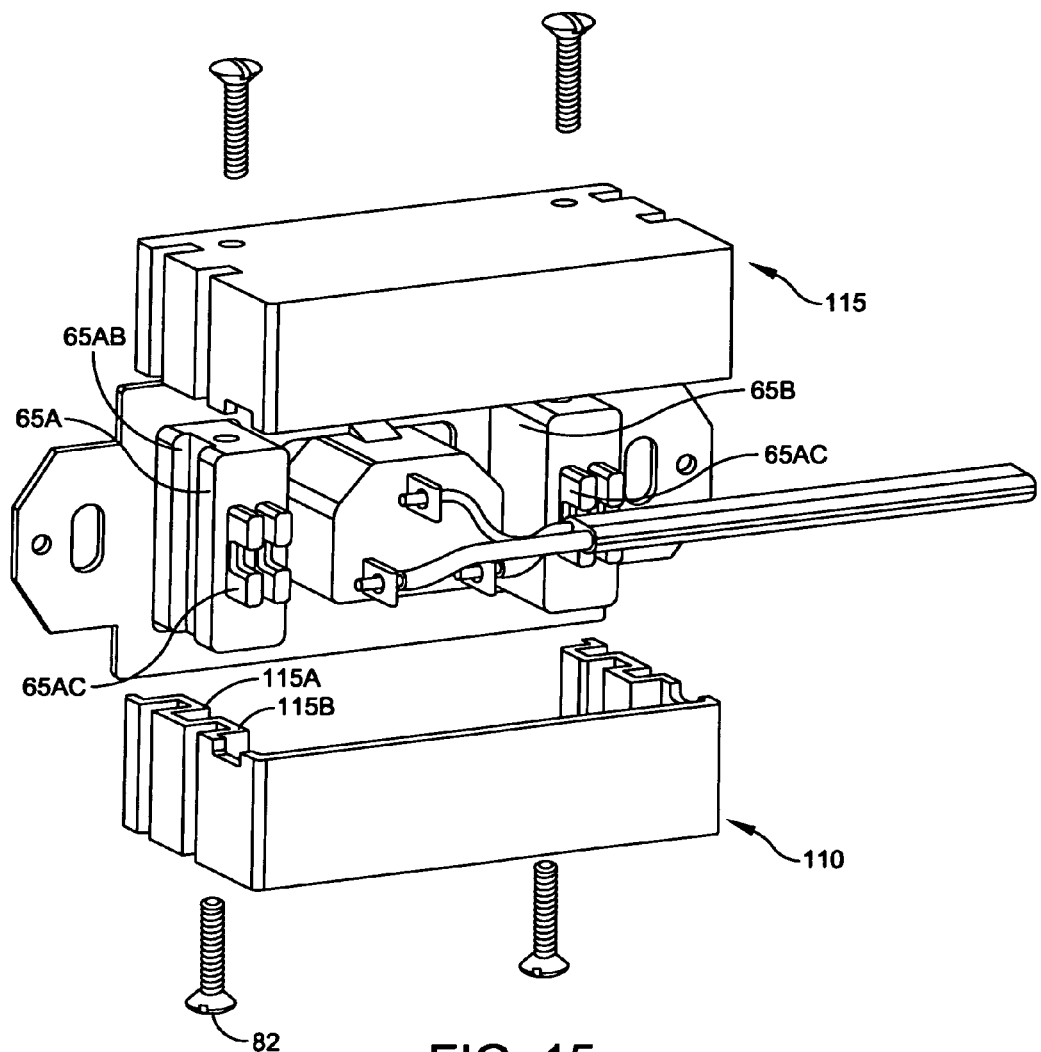
Figure 16:
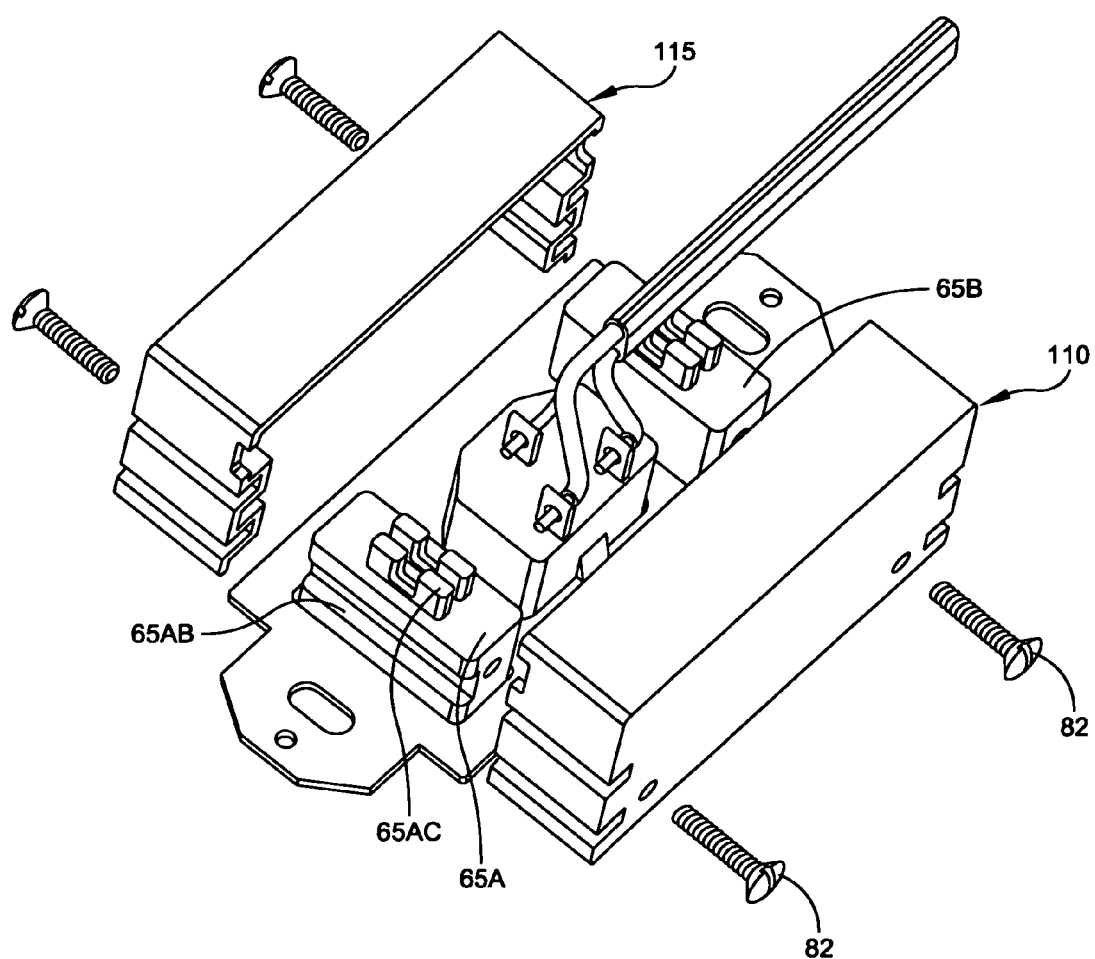
FIG. 16 illustrate a joinable section embodiment of the encased receptacle of the subject invention.

In yet another alternative embodiment, as illustrated in FIGS. 14-16, first and second mirrored joinable sections, 110 and 115, can be used to create the encased receptacle. The identical sections may include engagement tabs 115A and 115B. One of the tabs 115A may engage a recess 65AB of stanchions 65A and 65B while another tab 115B slideably engages a stanchion support member 65AC. This engagement allows for joinable sections 110 and 115 to be fixedly coupled to stanchions 65A and 65B while being joined together by screws 82. It is understood that any combination of similar structure for engagement tabs and recesses can be used to fixedly couple the joinable sections.

Figure 17:
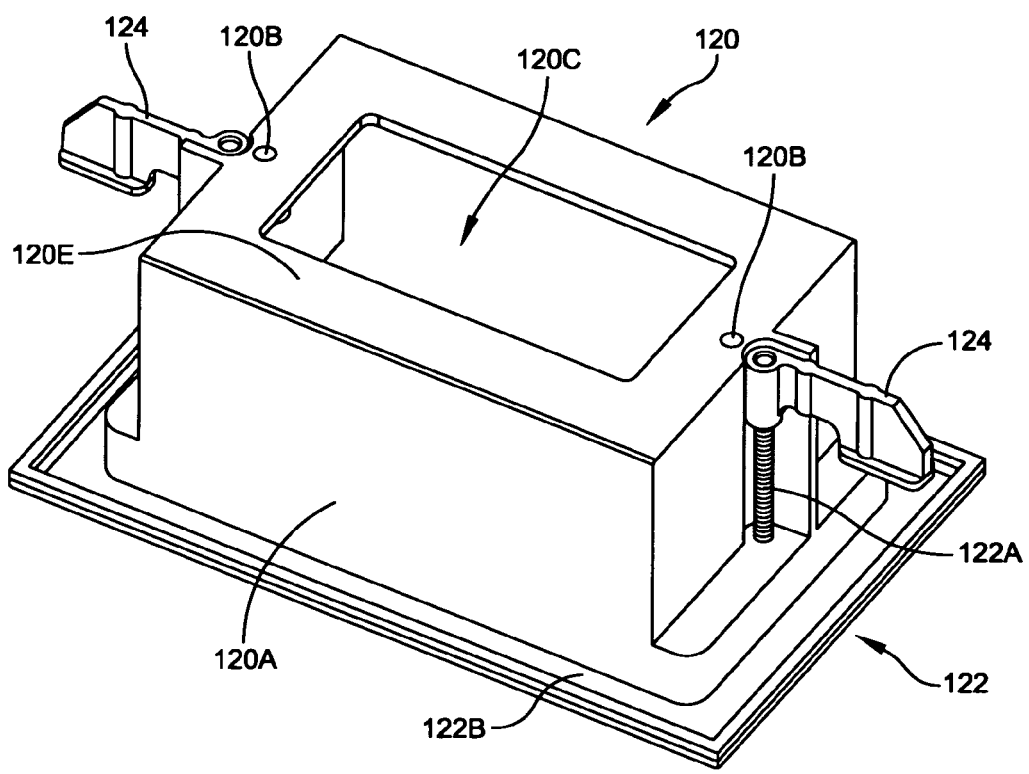
FIG. 17-19 illustrates a single gang recessed electrical box of the present invention.
Figure 18:
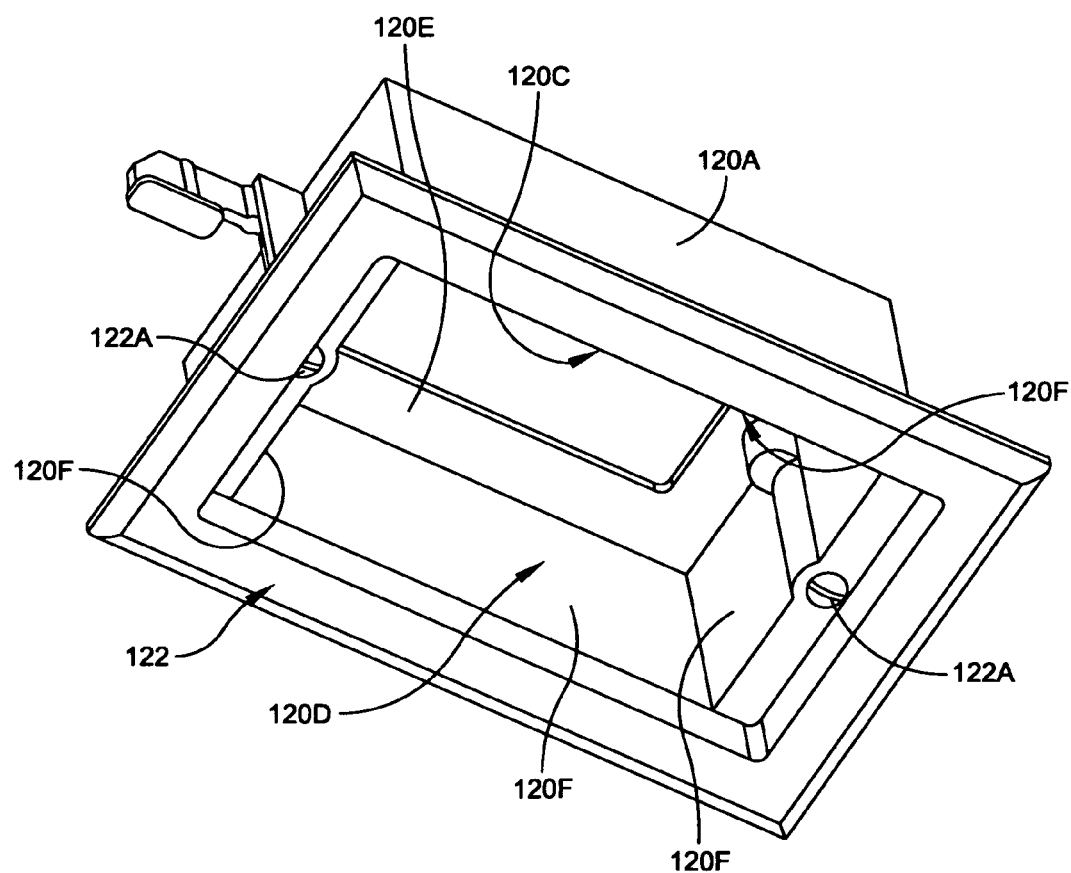
Figure 19:
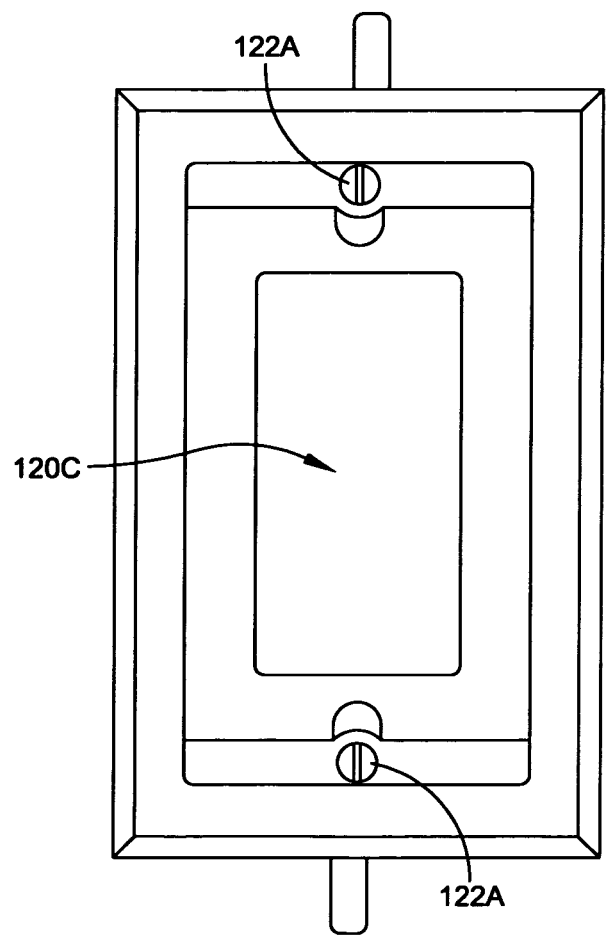

FIGS. 17-19 illustrate various embodiments of recessed electrical boxes or "deep Boxes", that can be utilized with the present invention. Referring to FIG. 17-19, the single gang recessed electrical box 120 includes an integrated face plate 122 with a flange 122B that extends outward beyond the periphery of box 120A. The box 120 includes wall mounting claws 124 that are adjustable to engage drywall or the like via positioning screws 122A. The box includes connection apertures 120B for securing any of the various embodiments of encased receptacles discussed herein. Opening 120C is approximately dimensioned to the dimensions of the receptacle ends of the integrated enclosures after mounting over opening 120C, and is smaller than opening 120D. As illustrated in FIG. 18, recessed box 120 includes an interior surface that projects rearward of opening 120D up to a rear panel 120E. Rear panel 120E extends inward from sides 120F of the interior surface.

Figure 24:
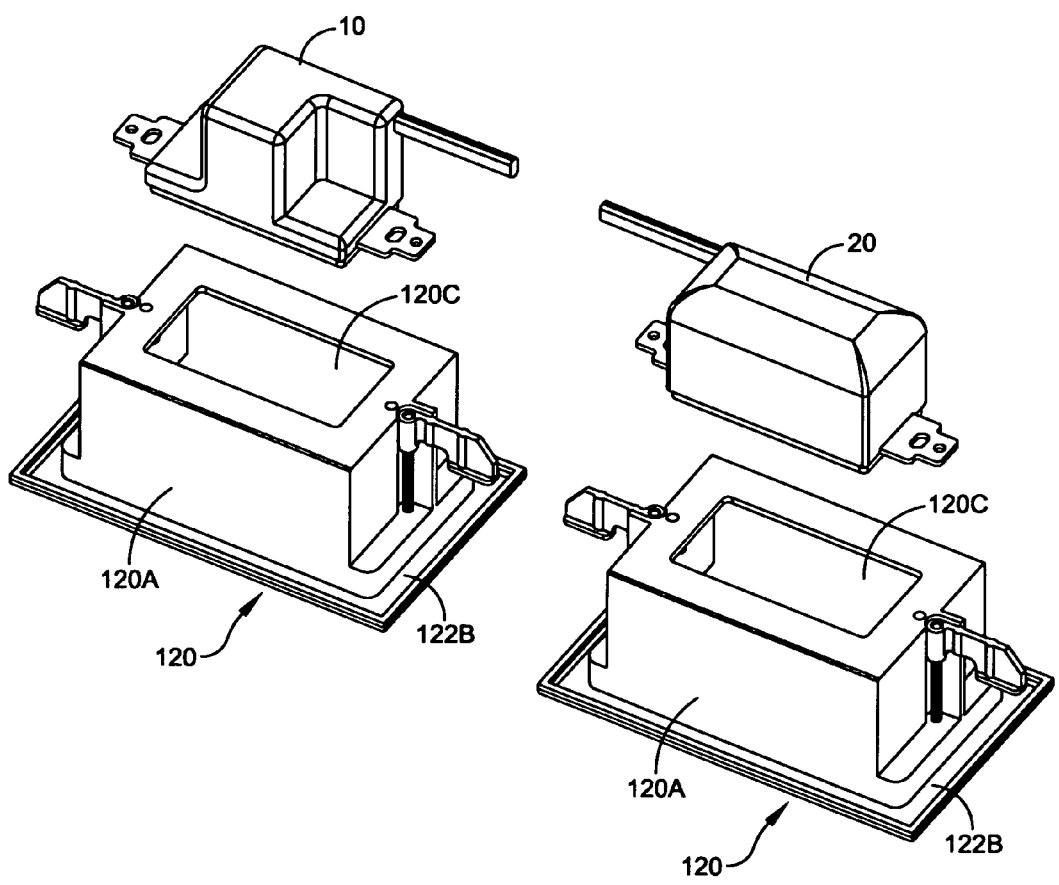
FIGS. 24-26 illustrates an encased receptacle of the present invention in combination with a recessed electrical box of the present invention.
Figure 25:
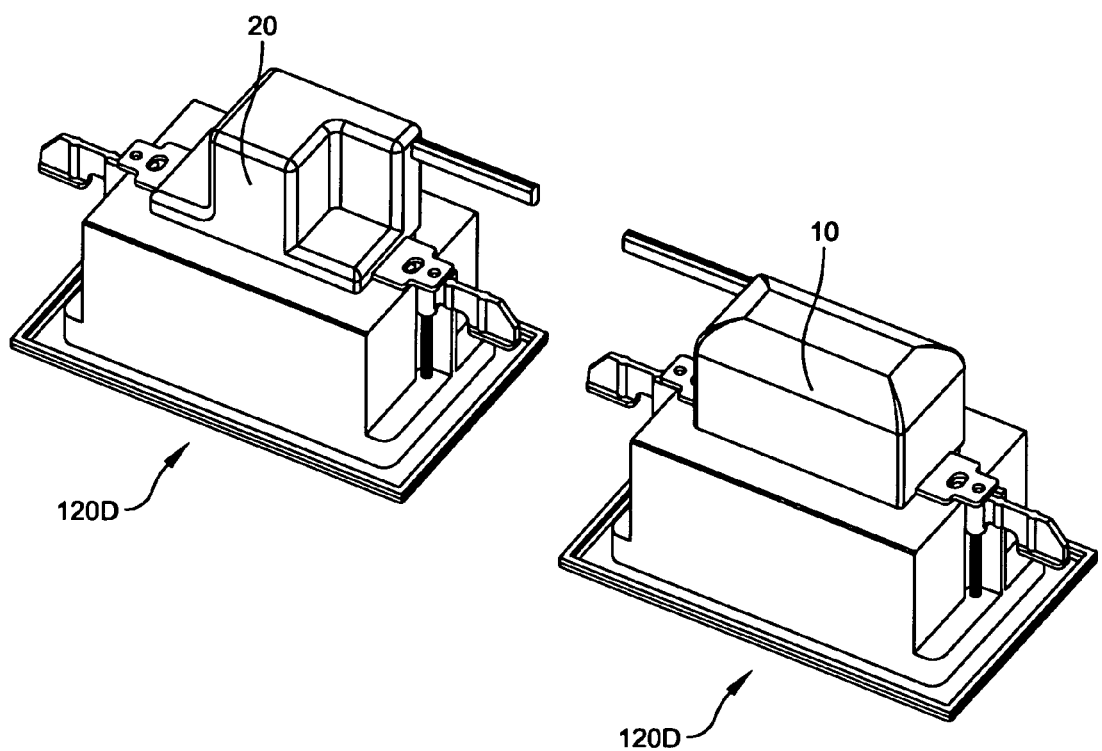
Figure 26:
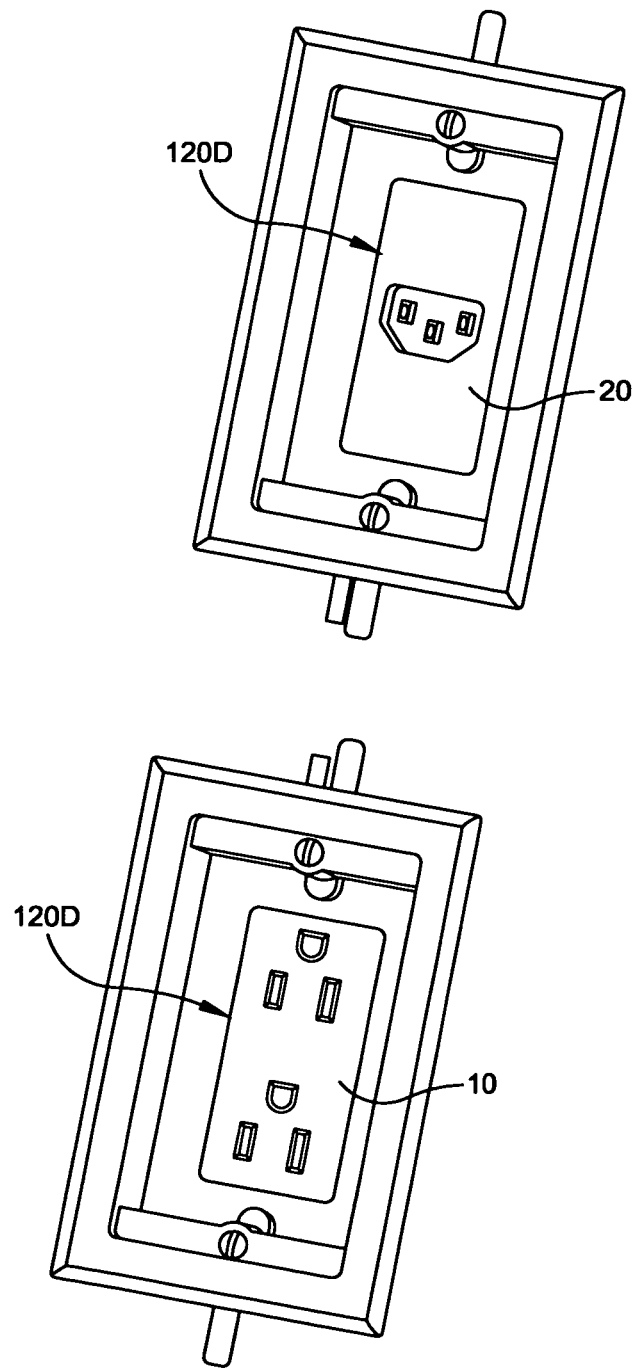
Figure 27:
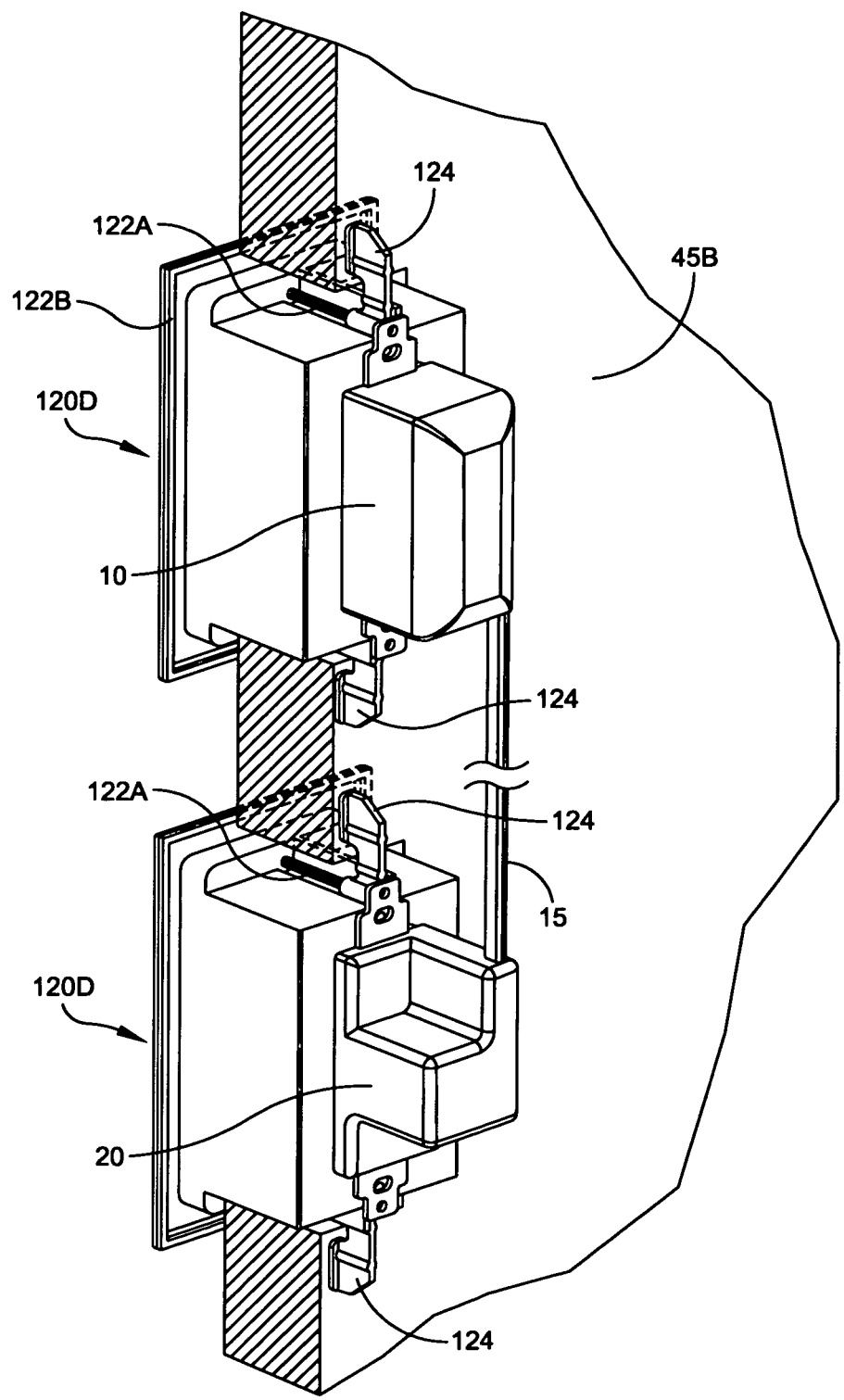
FIG. 27 illustrates an encased receptacle of the present invention in combination with a recessed electrical box of the present invention mounted to a wall.

Since the electrical receptacles are electrically isolated and pre-wired in one of the various forms described herein, they can be mounted external to recessed electrical box 120, as illustrated in FIGS. 24-26. This creates a deep opening within the wall, as illustrated in FIG. 27.

As illustrated in FIG. 26, a larger front opening 120D is of sufficient length and width to allow access to the mounted receptacles 10 located inward of opening 120D. As illustrated in FIG. 27, in the field, a hole would be cut in the wall at a dimension less than the periphery of face plate 122, flange 122B. Utilizing the engagement claws 124 against the interior wall mounting surface 45B by turning the positioning screws 122A, the claws would force the Flange 122B against the wall for a secure fit.

Figure 20:
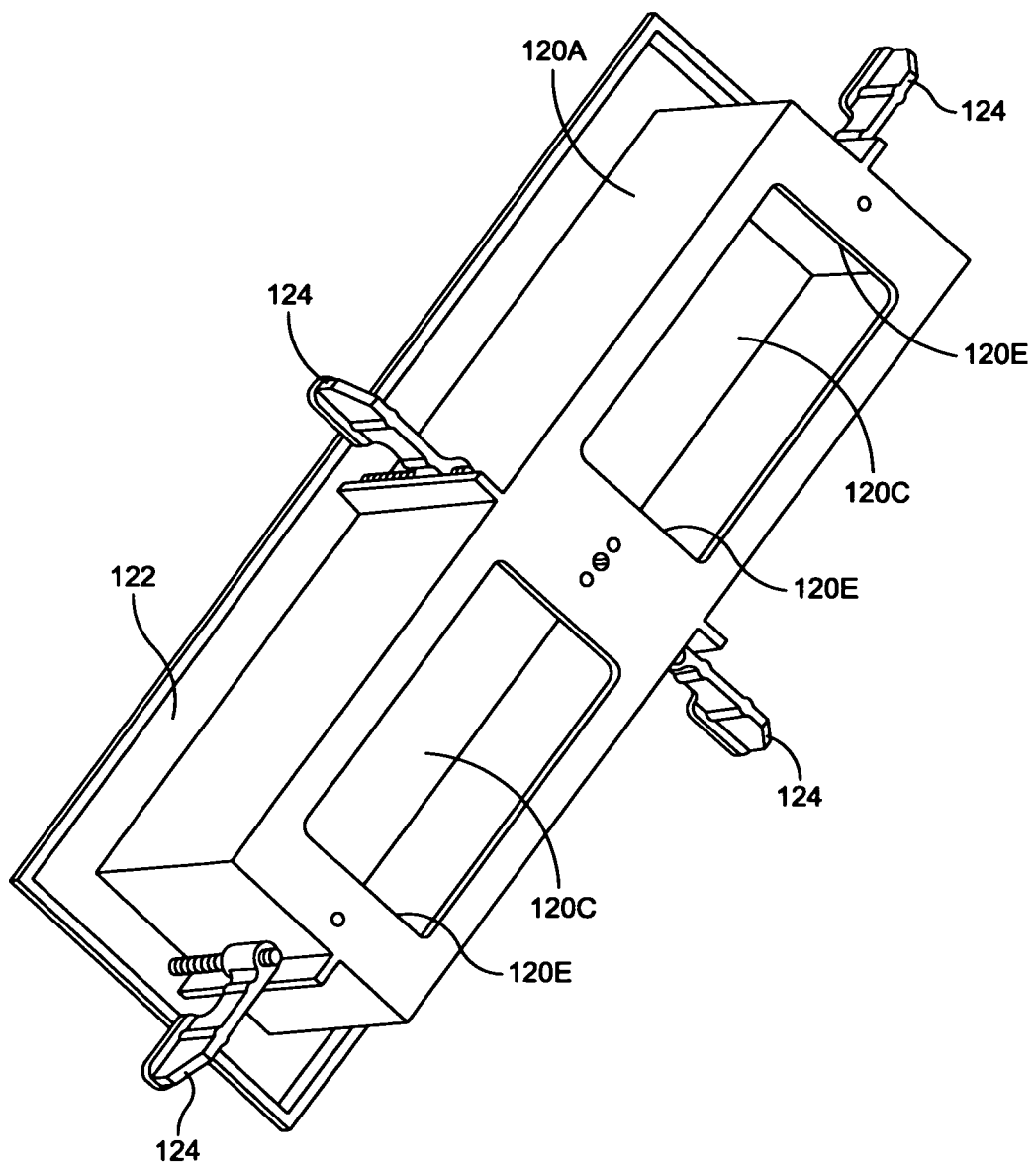
FIG. 20-21 illustrates a double gang recessed electrical box of the present invention.
Figure 21:
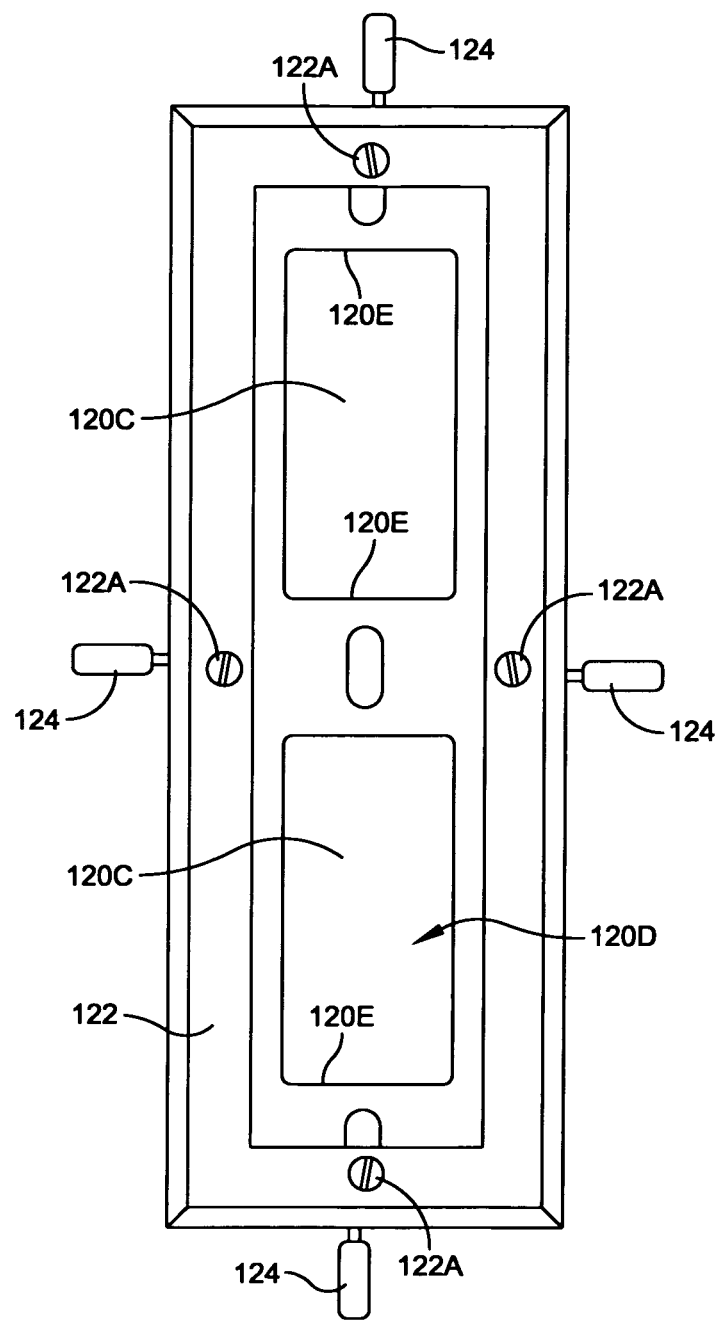
Figure 22:
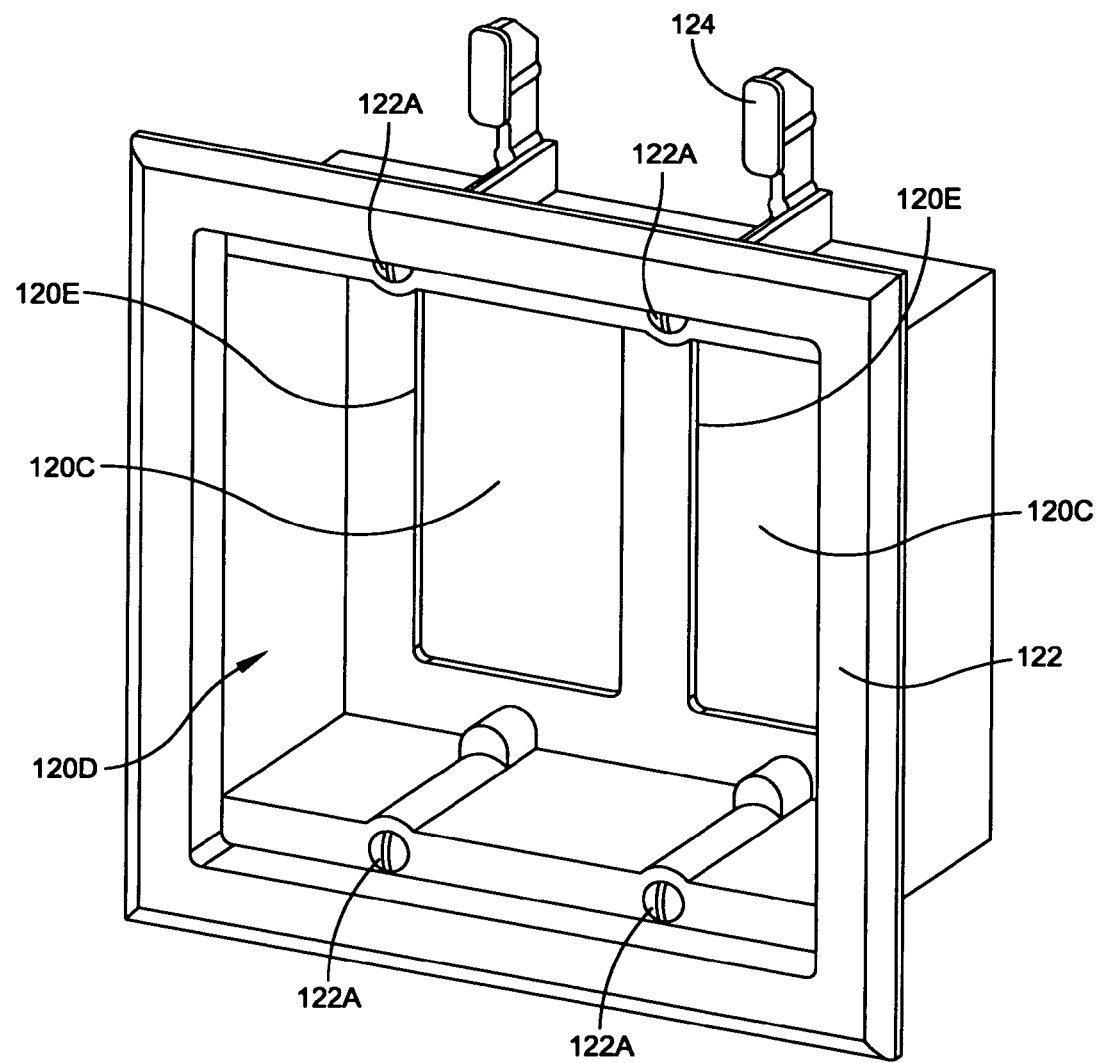
FIGS. 22-23 illustrates an alternative embodiment of a recessed electrical box of the present invention.
Figure 23:
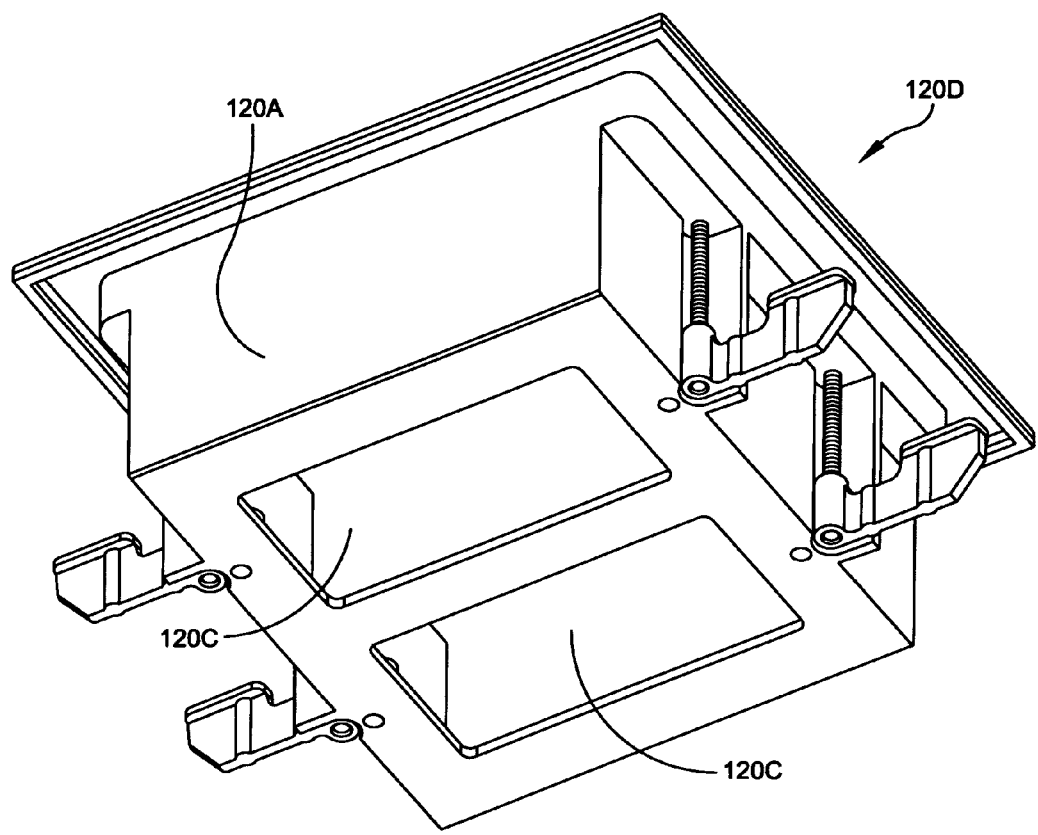

FIG. 20-21 illustrates a double gang "deep box" having the same functionality for the respective elements as described above, and further illustrates multiple openings 120C, in rear panel 120E. FIGS. 22-23 illustrate an alternative embodiment of the double gang recessed electrical box having the same functionality for the respective elements as described above.

I claim:

1. A combination power feed and recessed electrical box, comprising:
    first and second electrical boxes, said first and second boxes each having a first opening and a smaller second opening, wherein the perimeter of said first opening of said first and second recessed electrical boxes further include a flange, said flange extending outward from said first opening perimeter,
    wherein each of said first and second electrical boxes comprise an interior surface having sides that project generally rearward from said first opening up to a rear panel,
    wherein each of said first and second electrical boxes further include an exterior surface, said exterior surface further comprising at least one engagement claw mounted thereon, said engagement claw for securing said power feed and recessed electrical box to a wall, the wall having an interior hidden surface and exterior visible surface wherein said engagement claws of said first and second electrical boxes are adjustable inward towards said wall interior hidden surface forcing said flange towards said exterior visible surface to seat said flange and secure said first and second electrical boxes within said interior of said wall,
    said rear panel extending inward from each side of said interior surface, said rear panel comprising the smaller second opening, said rear panel having a first surface in communication with said interior surface and a second surface external to said first and second electrical boxes;
    an encased power input in communication with a mounting frame disposed thereon, said encased power input for receiving electrical power supplied thereto, said encased power input mounting frame affixed to said rear panel of said first electrical box, said encased power input accessible through said first opening and said smaller second opening of said first electrical box;
    an encased power output in communication with a mounting frame disposed thereon, said encased power output for delivering power to an electrical device, said encased power output mounting frame affixed to said rear panel of said second electrical box, said encased power output accessible through said first opening and said smaller second opening of said second electrical box;
    said encased power input and encased power output having an electrical interface therebetween.

2. A power feed device in combination with a recessed electrical box as in claim 1, wherein said first and second electrical boxes rear panels comprise a plurality of smaller second openings.

3. A power feed as in claim 1, wherein said encased power input and said encased power output of said first and second electrical boxes have a front face substantially coplanar with said rear panel first surface, said encased power input and said encased power output projecting away from said second external surface to create space internal to said electrical boxes.

4. A power feed device as in claim 1, wherein said power input is affixed to the exterior surface of said rear panel of said first electrical box, and said power output is affixed to the exterior surface of said rear panel of said second electrical box.

* * * * *